(12) United States Patent
Shan et al.

(10) Patent No.: US 11,139,805 B1
(45) Date of Patent: Oct. 5, 2021

(54) BI-DIRECTIONAL ADAPTIVE CLOCKING CIRCUIT SUPPORTING A WIDE FREQUENCY RANGE

(71) Applicant: SOUTHEAST UNIVERSITY, Nanjing (CN)

(72) Inventors: Weiwei Shan, Nanjing (CN); Jun Yang, Nanjing (CN); Longxing Shi, Nanjing (CN)

(73) Assignee: SOUTHEAST UNIVERSITY, Nanjing (CN)

( * ) Notice: Subject to any disclaimer, the term of this patent is extended or adjusted under 35 U.S.C. 154(b) by 0 days.

(21) Appl. No.: 16/957,724

(22) PCT Filed: Jul. 9, 2019

(86) PCT No.: PCT/CN2019/095202
§ 371 (c)(1),
(2) Date: Jun. 25, 2020

(87) PCT Pub. No.: WO2020/248318
PCT Pub. Date: Dec. 17, 2020

(30) Foreign Application Priority Data

Jun. 14, 2019 (CN) .......................... 201910514122.5

(51) Int. Cl.
*H03K 5/14* (2014.01)
*H03K 5/131* (2014.01)
*G04F 10/00* (2006.01)
*H03K 5/00* (2006.01)
*G06F 1/08* (2006.01)

(52) U.S. Cl.
CPC ............ *H03K 5/14* (2013.01); *G04F 10/005* (2013.01); *H03K 5/131* (2013.01); *G06F 1/08* (2013.01); *H03K 2005/00058* (2013.01)

(58) Field of Classification Search
None
See application file for complete search history.

(56) References Cited

U.S. PATENT DOCUMENTS 5,963,070 A    10/1999  Faulkner et al.
2018/0091125 A1*  3/2018  Carlson .................. G06F 1/324

FOREIGN PATENT DOCUMENTS

| CN | 103500243 A | 1/2014 |
| CN | 103997338 A | 8/2014 |
| CN | 105978539 A | 9/2016 |
| CN | 106026994 A | 10/2016 |

* cited by examiner

*Primary Examiner* — Cassandra F Cox
(74) *Attorney, Agent, or Firm* — Bayramoglu Law Offices LLC

(57) ABSTRACT

A two-way adaptive clock circuit supporting a wide frequency range is composed of a phase clock generating module, a phase clock selecting module, an adaptive clock stretching or compressing amount regulating circuit module and a control module. The adaptive clock stretching or compressing amount regulating circuit module can monitor delay information of a critical path in a chip in real time and feed the information back into the control module. After receiving a clock stretching or compressing enable signal and a stretching or compressing scale signal, the control module selects a target phase clock from clocks generated by the phase clock generating module to rapidly regulate an adaptive clock in a current cycle. The present invention is applied to an adaptive voltage frequency regulating circuit based on on-line time sequence monitoring.

8 Claims, 3 Drawing Sheets

BI-DIRECTIONAL ADAPTIVE CLOCKING CIRCUIT SUPPORTING A WIDE FREQUENCY RANGE

CROSS REFERENCE TO THE RELATED APPLICATIONS

This application is the national phase entry of International Application PCT/CN2019/095202, filed on Jul. 9, 2019, which is based upon and claims priority to Chinese Patent Application No. CN 201910514122.5 filed on Jun. 14, 2019, the entire contents of which are incorporated herein by reference.

TECHNICAL FIELD

The present invention relates to a two-way adaptive clocking circuit supporting a wide frequency range, which is implemented through a digital logic, and belongs to the technical field of basic electronic circuits.

BACKGROUND

With the continuous improvement of the integrated circuit process level, reducing power consumption has become an issue as important as performance improvement. Therefore, high performance and low power consumption have become important measurement metrics of the chip design quality. Due to mutual restraint between the two, energy efficiency is usually used to characterize the chip design quality. High energy efficiency is the goal that designers are constantly striving for. However, circuit design has great uncertainty in the manufacturing process and the operating environment. There are PVT (Process, Voltage, Temperature) variations including process variation, voltage fluctuation and temperature change, which have great impacts on normal function of a chip. Therefore, in order to ensure that the chip can operate normally in complex external environments, a sufficient timing margin is usually reserved in the circuit design process to ensure that the chip can work normally in the "worst case". Since these adverse timing variations are very difficult to occur simultaneously or will not occur at all, reserving excessive timing margin obviously causes waste of performance and power consumption, and thus the energy efficiency of the chip is seriously reduced.

Adaptive voltage scaling (AVS) is a very effective technical method for reducing the PVT timing margin. By using a transition detector to monitor timing information of a circuit, adaptive voltage scaling is carried out according to the feedback timing information. The PVT timing margin can be reduced or even completely removed by using AVS technology, so as to improve the energy efficiency of the circuit. By taking a classic on-line timing transition detector Razor as an example, the circuit is mainly composed of a flip-flop, a high-level transparent latch, an exclusive-OR gate and a data selector. When the timing is normal, the delay of the data path meets the requirement of set-up time of the flip-flop, and sampled values of the flip-flop and the latch are the same. When the timing is wrong, the latch can sample data correctly because it is in a transparent stage at the high level of a clock, while the flip-flop cannot sample a correct value due to the too late data arrival time or the short path problem. After it is detected that the circuit timing goes wrong, the system begins to enter into a data recovery and error correction stage and transmits the correct value sampled by the latch to the flip-flop through the data selector in the next cycle to ensure that the data is correct.

By using an on-line timing monitoring method to detect information reflected by the on-chip timing transition detector, the timing state in the current circuit operation process can be obtained. The system can regulate the voltage of a target circuit correspondingly according to the timing monitoring information fed back by the transition detector, so as to realize high energy-efficiency design of the chip. When chip data goes wrong, it indicates that the current circuit has a timing violation. At this time, the timing slack of the chip is negative. In order to ensure normal function of the chip, the current clock needs to be rapidly stretched (i.e. frequency reduction) to improve the timing slack. When the timing slack of the chip is larger, the timing slack can also be reduced by reasonably compressing the clock, so as to improve chip performance and reduce power consumption. Currently published clock stretching methods mainly include clock frequency division, DLL and PLL configuration. The frequency division method can realize immediate frequency reduction, but the frequency reduction often cannot realize fine-grained operation. Integer multiple frequency division performed on the clock makes the frequency of the chip be greatly reduced and performance be greatly reduced. A plurality of phase clocks can be generated by using a DLL. Whether fast variations are generated or not is detected through a fast variations detection module. Then, by switching different phase clocks, the clock cycle is fast changed through phase differences between the phase clocks. However, a DLL-based method has a long response time, high power consumption and area cost, cannot adapt to a low frequency, and has certain limitations. In addition, a smaller range of fast frequency regulating can be realized by using a PLL dynamic configuration method, but it is not suitable for low-cost embedded chip application due to its high applicable frequency, high design complexity and low universality.

SUMMARY

The invention objective of the present invention is to provide a two-way adaptive clocking circuit with a shorter response time and a finer stretching scale in view of the deficiencies of the above related art, and the stretching or compressing amount of the clock can be adaptively regulated according to current working conditions so that the timing margin can be reduced to the utmost extent. The present invention performs a fine-grained fast stretching or compressing operation on the clock under a control signal according to circuit delay information fed back by a timing transition detector. The implementation cost is low and the circuit structure is complete. A high-precision and fine-grained stretching or compressing operation of clock signals within a wide frequency range is realized. The technical problem that the existing clock signal circuit needs to sacrifice a certain precision cost in exchange for an area cost and the supported frequency regulating range is narrow is solved.

The present invention adopts the following technical solution to realize the above invention objective:

A two-way adaptive clocking circuit supporting a wide frequency range includes:

a phase clock generating module, generating N clocks with different phases through a system clock, wherein N is an integer greater than 1;

a phase clock selecting module, selecting a proper target phase clock from the system clock and the N phase clocks according to adaptive clock selecting control signals to be output, so as to realize an operation of stretching or compressing the system clock in the current cycle;

an adaptive clock stretching or compressing amount regulating circuit module, monitoring delay information of delay units in the chip in real time and feeding the information back to the control module; and the control module, generating the adaptive clock selecting control signals according to the delay information fed back by the adaptive clock stretching or compressing amount regulating circuit module.

Preferably, the adaptive clock stretching or compressing amount regulating circuit module includes:

a frequency-halving circuit, performing frequency-halving on the adaptive clock clk_out input to the module through D flip-flops to obtain frequency-divided clocks;

a critical path replica module, formed by series connection of a plurality of levels of combinational logic gates and configured to simulate delay information of the critical path;

a transition detector group circuit, composed of N/2 transition detectors (TDs) and N/2 high-level transparent latches and configured to monitor the delay information of current circuit and direct selecting of a clock stretching or compressing amount; and a 2-to-1 data selector circuit, selecting stretching or compressing of the current system clock according to whether a circuit timing is tight or not, and controlling the input signal of the TD group as a timing early-warning signal provided by the on-line timing TD or a delay signal generated by the critical path replica, thereby obtaining the delay information of the current circuit and transmitting the delay information of the current circuit to the control module.

Preferably, the phase clock generating module includes:

A phase clock generating circuit of a double-delay-line structure, including two delay lines, wherein the first delay line is a fast delay line with short delay, which generates high-frequency phase clocks; and the second delay line is a slow delay line with long delay, which generates low-frequency phase clocks. Each delay line is formed by series connection of N/2 levels of delay units, each level of delay units is connected with one level of inverters behind to generate an inverted clock signal, and the N clocks with different phases are totally generated. The double-delay-line structure is controlled by M 2-to-1 data selectors, and only one delay line works at the same time.b The fast delay line and the slow delay line are different in that the single level of delay unit uses different number of basic units, the number of the delay units of the fast delay line is less than that of the delay units of the slow delay line, and thus the fast delay line has a shorter delay time.

A time-digital-converter (TDC) circuit, detecting information of the delay lines through the M phase clocks generated by the phase clock generating circuit, wherein M is less than or equal to N/2. After the system is powered on, the TDC circuit detects delay situations of the fast delay line by default. If M output values of the TDC circuit include 0 and 1, that is, the frequency meets the requirement of the fast delay line, the current fast delay line is kept used to generate the phase clocks; and if the M output values of the TDC circuit only include 0, that is, the frequency does not meet the requirement of the fast delay line, the fast delay line is switched to the slow delay line to generate the phase clocks.

Further preferably, the phase clock selecting module includes:

A phase clock receiving circuit, including N low-level transparent latches and N AND gates and configured to correctly receive the adaptive clock selecting control signals from the control module. The N adaptive clock selecting control signals respectively serve as data input signals of the N latches, the N phase clocks respectively serve as clock input signals of the N latches to be synchronously processed with the corresponding control signals, and data output signals of the N latches and the clock input signals of the N latches are respectively subjected to an AND operation through the AND gates.

An N-input OR gate circuit, configured to select and output the target phase clock clk_out.

The present invention adopting the above technical solution has the following beneficial effects:

(1) The two-way adaptive clocking circuit disclosed by the present invention can support regulating within a wide frequency range. The phase clock generating module can meet requirements of different frequency ranges by adopting the double-delay-line structure. Each delay line has different minimum unit delay precision, wherein one delay line only works at a high frequency, while the other delay line only works at a low frequency. Then delay information of the delay lines is judged in combination with the TDC circuit. The proper delay line is switched to generate the phase clocks according to system needs. In order to make the phase clocks stable, the present invention places the whole adaptive clocking circuit in a fixed high-voltage domain instead of a variable-voltage domain, so as to avoid influences of fast variations brought by low voltage on circuit performance.

(2) The two-way adaptive clocking circuit disclosed by the present invention can adaptively regulate the clock stretching or compressing amount according to the current working conditions and has the technical advantages of shorter response time and finer stretching scale. Determining the clock stretching or compressing amount is a major difficulty of the present invention. The clock stretching or compressing amounts required for the fast variations in different PVT environments are different. The required clock stretching or compressing amount is larger when the PVT environments are poor and smaller when the PVT environments are good. Hence, the present invention introduces a clock stretching or compressing amount regulating circuit. By using the TDs to monitor the timing of signals carrying the delay information of the critical path, the clock stretching or compressing amount suitable for the current PVT environment can be obtained. Compared with other traditional clock stretching methods, the method can not only response in one cycle, but also can stretch the system clock to a finer degree, so as to ensure that the chip can solve a circuit timing violation without too much performance loss.

(3) The two-way adaptive clocking circuit disclosed by the present invention has low area and power consumption costs. The present invention realizes required circuit functions through digital logics, and is concise in circuit structure, good in effect and especially suitable for an adaptive voltage frequency scaling circuit based on on-line timing monitoring.

DETAILED DESCRIPTION OF THE EMBODIMENTS

The following describes the technical solutions of the present invention in detail with reference to accompanying drawings.

Figure 1:
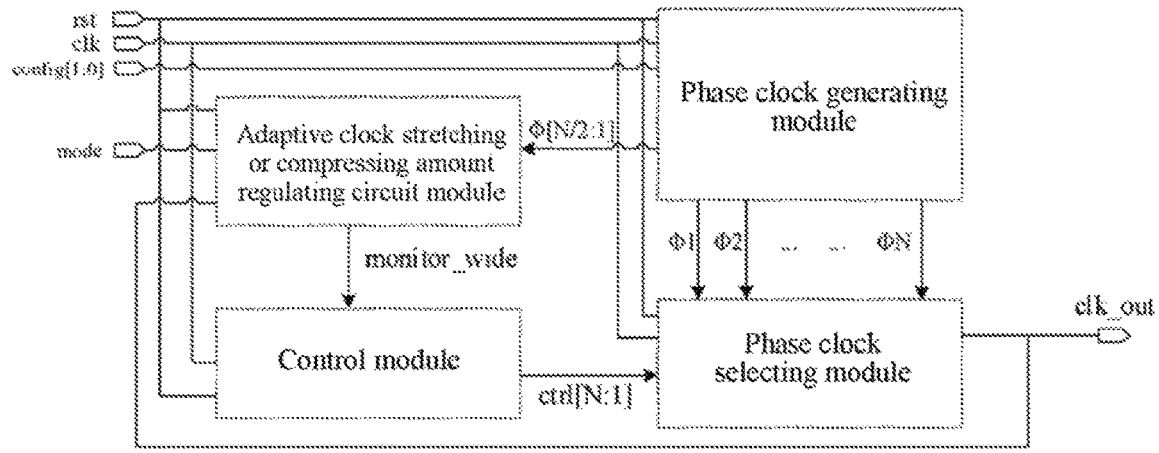
FIG. 1 is a block diagram of the two-way adaptive clocking circuit supporting a wide frequency range.

As shown in FIG. 1, a two-way adaptive clocking circuit supporting a wide frequency range disclosed by the present invention includes a phase clock generating module, a phase clock selecting module, an adaptive clock stretching or compressing amount regulating circuit module and a control module. External input signals of the circuit are as follows: a system clock clk, a reset signal rst, a clock stretching or compressing function selecting signal mode and a delay line configuration signal config[1:0]. The output signal is a clock clk_out generated by the adaptive clock circuit. The adaptive clock stretching or compressing amount regulating circuit module monitors delay information of delay units in the chip in real time so as to detect the operation environment of the current circuit and feeds the delay information back to the control module. The control module receives delay information monitor_wide of the current circuit provided by the adaptive clock stretching or compressing amount regulating circuit module. Clock selecting control signals ctrl[N:1] are generated through a decoder circuit, and the clock selecting control signals ctrl[N:1] direct the phase clock selecting module to select a target phase clock clk_out from clocks generated by the phase clock generating module, so as to stretch the system clock under different PVT environments in a single cycle.

Input signals of the phase clock generating module are a system clock clk and a reset signal rst. Output signals are N phase clocks Φ[1]-Φ[N] with different phases. The phase clock generating module outputs the Φ[1]-Φ[N] to the input ends of the phase clock selecting module. The phase clock generating module outputs Φ[1]-Φ[N/2] to the input ends of the adaptive clock stretching or compressing amount regulating circuit module. N is an integer greater than 1.

Input signals of the adaptive clock stretching or compressing amount regulating circuit module are as follows: a system clock clk, a reset signal rst, phase clocks Φ[i] (i=1, 2 . . . N/2) and a clock stretching or compressing function selecting signal mode. The delay information monitor_wide of the current circuit is output to the input end of the control module.

Input signals of the control module are as follows: a system clock clk, a reset signal rst and the delay information monitor_wide of the current circuit from the adaptive clock stretching or compressing amount regulating circuit module. The N clock selecting control signals ctrl [N:1] are output to the input ends of the phase clock selecting module.

Input signals of the phase clock selecting module are as follows: a system clock clk, a reset signal rst, phase clocks Φ[i] (i=1, 2 . . . N) and the control signals ctrl[N:1] from the control module. A stretched or compressed clock clk_out is output.

Figure 2:
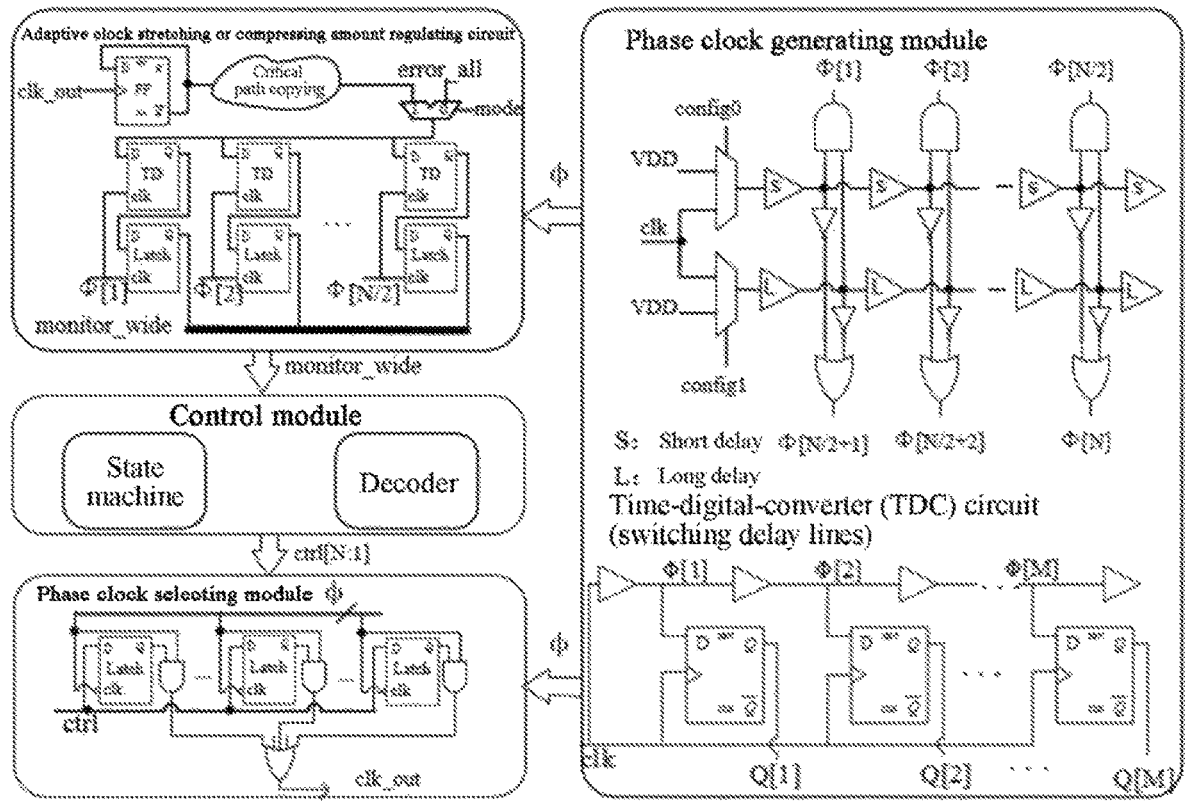
FIG. 2 is a schematic diagram of the two-way adaptive clocking circuit supporting the wide frequency range.

As shown in FIG. 2, the adaptive clock stretching or compressing amount regulating circuit module utilizes a plurality of groups of transition detectors (TDs) and latches to detect the timing early-warning signal generated by the on-line timing TD at the tail end of the critical path or the delay signal generated by the critical path replica. The delay information monitor_wide of the current circuit is output. The delay information of the current circuit is presented in a form of thermometer code. A junction position of 0 and 1 in the thermometer code is a position of the rising edge of the foregoing timing early-warning signal or delay signal. By transmitting the monitor_wide to the subsequent control module, the clock selecting control signals ctrl [N:1] are output to direct the system to select a proper target clock signal from the N phase clocks generated by the phase clock generating module, so as to stretch or compress the system clock under current PVT environments in the current cycle.

The phase clock generating module is composed of two sub-circuits, which are respectively a phase clock generating circuit and a time-digital-converter (TDC) circuit. The phase clock generating circuit adopts a double-delay-line structure to generate phase clock signals. Two delay lines are independent of each other and are each composed of 20 levels of delay units, and each delay unit is formed by cascade connection of same basic units CLKBUFV4_7TL140_C30. The first delay line is a fast delay line with short delay, which supports generating high-frequency phase clocks. The second delay line is a slow delay line with long delay, which supports generating low-frequency phase clocks. The constituting difference between the two delay lines is that a single level of delay units uses different number of basic units, wherein the delay units of the slow delay line are formed by cascade connection of K (such as 30) buffers, and the delay units of the fast delay line are formed by cascade connection of L (such as 5) buffers. By taking the system clock clk as an initial input signal of the delay chain, each level of delay units generates a certain phase shift to the system clock. Each delay line is formed by series connection of the N/2 levels of delay units. Each level of delay units is connected with one level of inverters behind to generate an inverted clock signal. The N clocks with different phases are totally generated. As for the phase clocks generated on each delay line, a delay time between the adjacent phase clocks is a delay time of 1 delay unit under the current PVT environments. Only one delay line of the double-delay-line structure works at the same time according to the needs of a system frequency. The TDC circuit detects information of the delay lines through M generated phase clocks, wherein M is less than or equal to N/2. After the system is powered on, the TDC circuit detects a delay situation of the fast delay line by default. If M output values of the TDC circuit include 0 and 1, that is, the frequency meets the requirement of the fast delay line, the current fast delay line is kept used to generate the phase clocks. If the M output values of the TDC circuit only include 0, that is, the frequency does not meet the requirement of the fast delay line, the fast delay line is switched to the slow delay line to generate the phase clocks.

The adaptive clock stretching or compressing amount regulating circuit module includes: a frequency-halving circuit, a critical path replica module, a transition detector group circuit and a 2-to-1 data selector circuit. The frequency-halving circuit performs frequency-halving on the adaptive clock clk_out input to the module through D flip-flops to obtain frequency-divided clocks. The critical path replica module is formed by series connection of a plurality of levels of combinational logic gates and configured to simulate delay information of the critical path. The transition detector group circuit analyzes timing information of the critical path through TD and high-level transparent latch combinations to obtain adaptive clock stretching or compressing amount information. Input clocks of all the TD and latch combinations are the different phase clocks Φ[1]-Φ[N/2], so that sampling results are a series of thermometer codes, such as 1111_1111_1111_0000_0000, wherein a junction of 1 and 0 is within a position range of the rising edge of the input signal of the transition detector group circuit. Clock stretching and compressing functions have different application scenarios in the whole system, that is, the clock needs to be stretched when the timing of the system is tight, so that the on-line timing TD can monitor a high-level timing early-warning signal in time. The clocks need to be compressed when the timing of the system is relatively loose, so that the on-line timing TD cannot effectively acquire the delay information of the critical path at the moment. Therefore, a critical path replica needs to be additionally introduced to describe delay information of the current system. The above two situations are controlled by the 2-to-1 data selector circuit. The select signal mode of the 2-to-1 data selector circuit selects the clock stretching or compressing function. The input signal of the TD group is controlled according to whether the timing is tight or not, so as to obtain the delay information of the current circuit and transmit it to the control module. When mode=0, the error_all signal is selected to be input into the TD group circuit. The error_all signal is the timing early-warning signal sent out by the system carried by clock stretching and is configured to direct selecting of the clock stretching amount. When mode=1, the cpr_out signal obtained by the critical path replica is selected to be input into the TD group circuit and configured to direct selecting of the clock compressing amount. The TDs monitor the position of a jump edge of the error_all or cpr_out signal relative to the rising edge of the Φ[1]-Φ[N] so that the timing violation value/timing slack of the current circuit can be obtained. The module introduces the high-level transparent latches to cooperate with the TDs for monitoring because the monitoring signal obtained by the TDs is a positive pulse, and its level width is less than half a cycle. Therefore, the monitoring signal may be attenuated in subsequent signal transmission and needs to be widened. A monitor_wide signal is finally obtained to be output to the control module.

Figure 3:
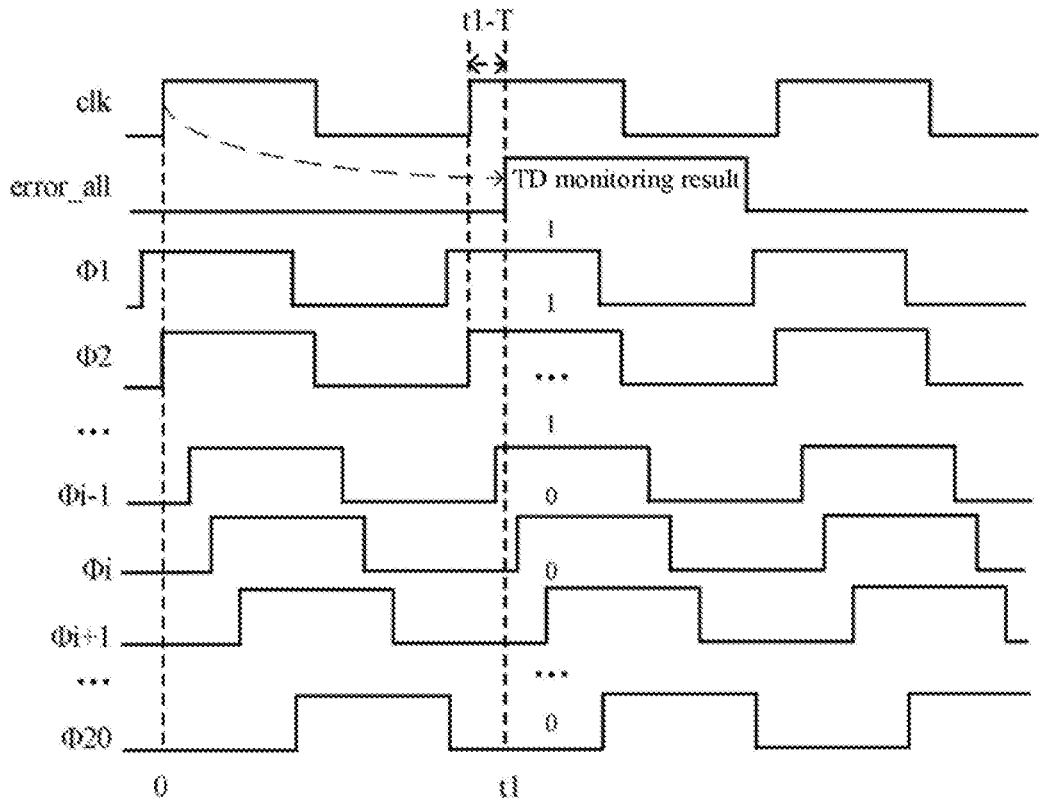
FIG. 3 is a timing diagram of selecting an adaptive clocking stretching amount.

As for the clock stretching function, the system continuously switches the current phase clock to a phase-lag clock according to the monitor_wide signal given by the TD group circuit so as to widen the clock cycle and relieve the tight timing. As for the clock compressing function, the system continuously switches the current phase clock to a phase-lead clock according to the monitor_wide signal given by the TD group circuit so as to compress the clock cycle and reduce the timing slack. The adaptive clock stretching amount selecting function is illustrated below by taking the clock stretching function as an example. FIG. 3 shows a timing diagram of selecting an adaptive clock stretching amount. When the timing is normal, the signal of the critical path should arrive before the next rising edge of the clk, but it arrives at the moment of t1 due to influences of fast variations, and thus, the timing early-warning signal error_all is generated. Accordingly, it can be known that the length of the critical path is t1, and the timing violation value is t1−T. The delay difference between the phase clock Φi and the system clock clk is $\Delta T*i$ ($i=1, 2, \ldots N/2$, and $\Delta T$ is delay between the two phase clocks), and thus the target phase clock Φi selected finally should meet the following condition:

$$\Delta T*(i-1) < t1 < \Delta T*i,$$

That is, if the jump of error_all signal occurs between monitoring windows of $(i-1)^{th}$ and $(i)^{th}$ TDs, the delay of critical path can be covered by stretching the current phase clock by $\Delta T*i$, namely switching the current phase clock to the $(i)^{th}$ phase clock. Therefore, the stretching amount is reasonable.

The control module is composed of a state machine circuit and a decoder circuit. The state machine circuit controls the whole adaptive clocking circuit to be switched among stretching, compressing and idle states. The decoder circuit generates the N clock selecting control signals ctrl[N:1] according to the delay information monitor_wide of the current circuit of the adaptive clock stretching or compressing amount regulating circuit module and judges a selected target clock so as to meet requirements of the timing of the critical path. In each cycle, only one of the N clock selecting control signals ctrl[N:1] is in high level, and the others are in low level, wherein the high-level control signal represents selection of the corresponding phase clock.

The phase clock selecting module includes a phase clock receiving circuit and an N-input OR gate circuit. The phase clock receiving circuit includes N low-level transparent latches and N AND gates and is configured to correctly receive the adaptive clock selecting control signals ctrl[N:1] from the control module. The N adaptive clock selecting control signals respectively serve as data input signals of the N latches, and the N phase clocks respectively serve as clock input signals of the N D latches to be synchronously processed with the corresponding control signals so as to avoid generating glitches during clock selecting. Data output signals of the N latches and the clock input signals of the N latches are respectively subjected to an AND operation through the AND gates. The N-input OR gate circuits are configured to select and output the target phase clock clk_out.

In order to make the clock of the whole system be capable of being stretched or compressed continuously, the present invention takes an output clock clk_out of the adaptive clocking circuit as an input clock source, instead of the system clock clk. Since the adaptive clocking circuit needs to respond to the external timing early-warning signal and the timing early-warning signal is in a synchronous relationship with the clk_out and is in an asynchronous relationship with the system clock clk, in order to avoid switching the clock into the system clock and possibly generating unnecessary glitch signals after each time of stretching or compressing, the present invention changes the input clock signal into the clk_out from the system clock clk. The whole adaptive clocking circuit and the carrying platform thereof constitute a logic of synchronous operations.

Figure 4:
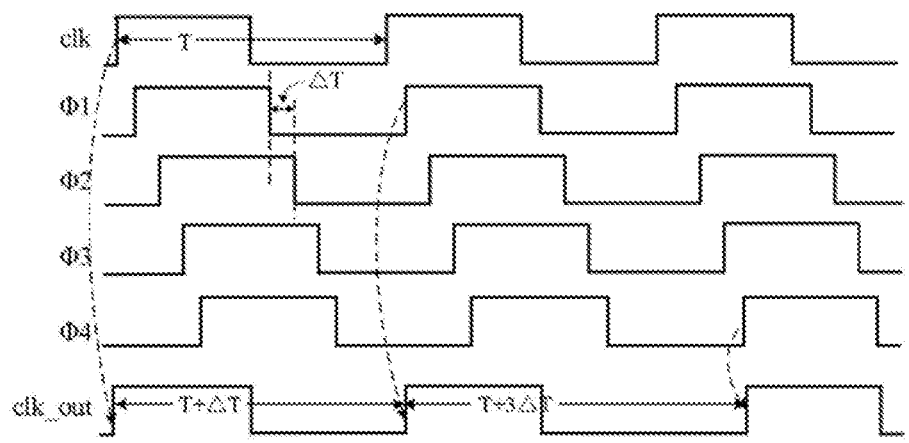
FIG. 4 is a timing diagram of the adaptive clock stretching principles.

FIG. 4 shows a timing diagram of the adaptive clock stretching principles. The clock stretching operation is to select the required target phase clock according to the different monitored timing information of the critical path, so as to make the whole system have correct functions and meet timing requirements. The present invention specifically illustrates the clock stretching principles with FIG. 4 as an example, that is, the input clock signal of the system in the previous cycle is reasonably stretched in each cycle. The initially-input system clock is clk. In the first cycle, the timing early-warning signal error_all is monitored by the TDs at the tail end of the critical path of the system and fed back to the TD group circuit (TDs+latches) to generate the monitor_wide signal to be transmitted to the control module so as to generate the clock selecting control signals ctrl[N:1], wherein ctrl[1]=1, and ctrl[N:2]=0, so that the system selects the phase clock Φ1 as the target clock to stretch, that is, the rising edge of the next cycle is the rising edge of the phase clock Φ1. In the second cycle, as well, in the generated clock selecting control signals, ctrl[4]=1, and the others are all 0, so that the system selects the phase clock Φ4 as the target clock to stretch, that is, the rising edge of the next cycle is the rising edge of the phase clock Φ4. The whole system completes clock stretching according to this rule, and clock compressing principles are similar.

In one specific implementation case of the two-way adaptive clocking circuit supporting a wide frequency range of the present invention, the circuit proposed by the present invention is carried on an 8-bit AES password circuit platform to perform adaptive clock stretching or compressing function verification. The circuit is subjected to function simulation under different PVT environments by adopting the 28 nm process library provided by SMIC and utilizing software simulation platforms such as VCS and HSIM provided by Synopsys company. Circuit structures of all modules are designed based on the above technical solution. The circuit is modeled through Verilog HDL language, and its circuit functions are subjected to simulation verification. The number N of the delay units in the two delay lines of the phase clock generating module of the circuit is set to be 40 (each delay line includes 20 delay units). The circuit is respectively placed under different clock frequency conditions and different PVT conditions for simulation to obtain simulation results shown in FIG. 5, FIG. 6 and FIG. 7.

Figure 5:
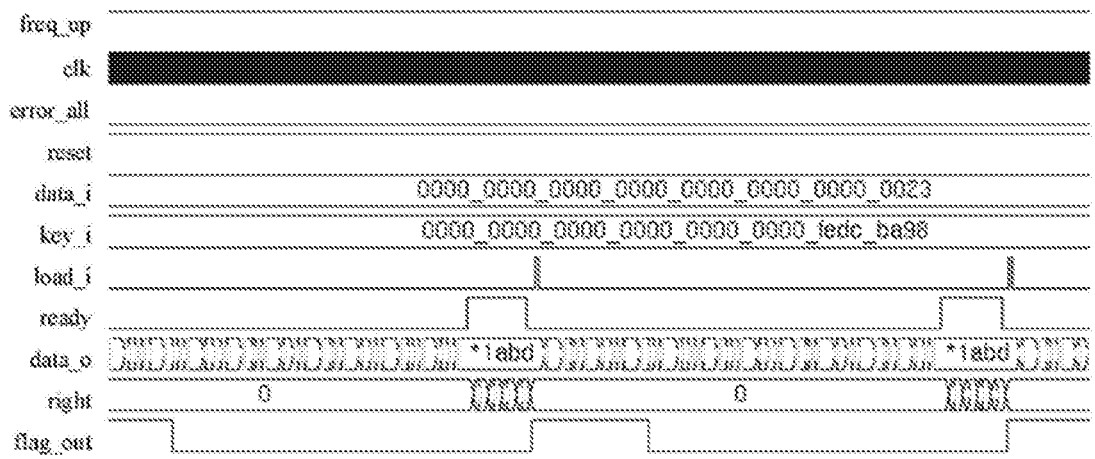
FIG. 5 is a timing diagram of system function verification in combination with adaptive clock compressing at TT_1.05V_25° C.

FIG. 5 shows the oscillogram of overall system function verification. The PVT environment where the system is located currently is set to be TT process corner, 1.05 V and 25° C. The frequency of the system clock is 710 MHz, that is, a clock cycle is about 1.4 ns. At the moment, the timing of the system is relatively loose, the timing early-warning signal error_all is lowered, and therefore, the system starts the adaptive clock compressing function to compress the timing slack. Meanwhile the function signal flag_out generated by the 8-bit AES password circuit platform is raised after one time of encryption. It indicates that the system functions are correct in combination with the adaptive clock compressing function.

Figure 6:
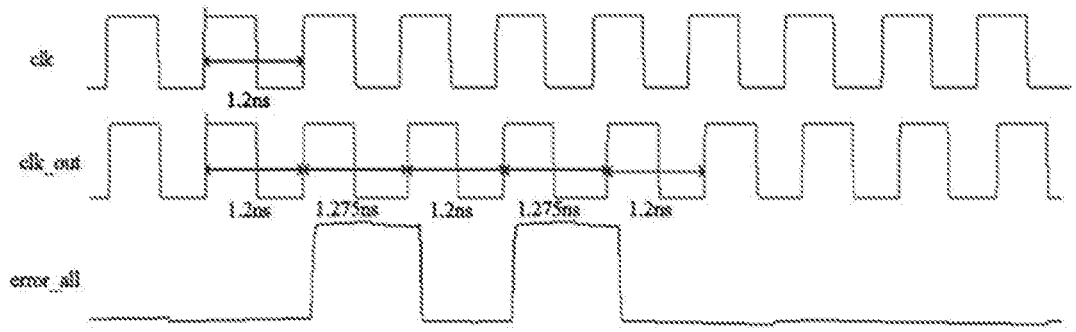
FIG. 6 is an oscillogram of adaptive clock stretching of a system in a conventional voltage area at TT_1.05V_25° C.

FIG. 6 shows the oscillogram of realizing adaptive clock stretching of the system in the conventional voltage area. The PVT environment where the system is located currently is set to be TT process corner, 1.05 V and 25° C. The frequency of the system clock is 830 MHz, that is, a cycle is about 1.2 ns. When the timing of the system is relatively tight, the timing early-warning signal error_all is generated. The signal is immediately fed back to the adaptive clock stretching circuit, and the clock is stretched to a clock cycle of 1.275 ns in the current cycle, which effectively relieves the problem of the tight timing of the system under a conventional voltage.

Figure 7:
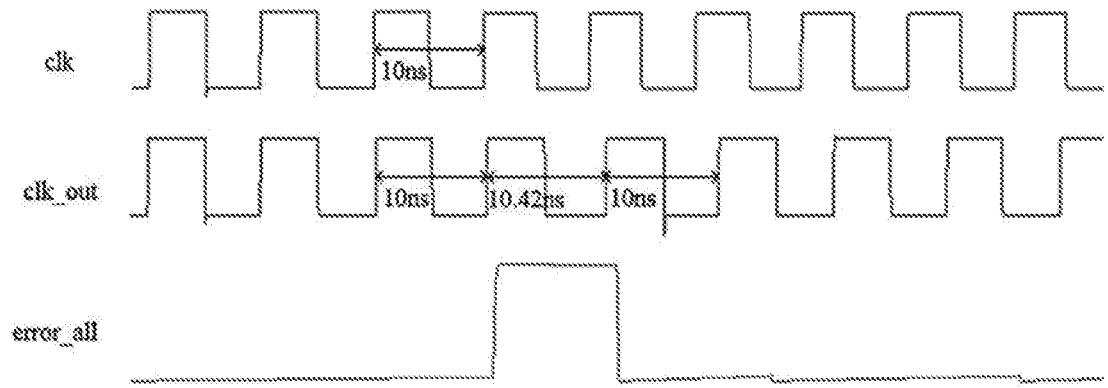
FIG. 7 is an oscillogram of adaptive clock stretching of the system in a low-voltage area at TT_0.6V_25° C.

FIG. 7 shows the oscillogram of realizing adaptive clock stretching of the system in a low-voltage area. The PVT environment where the system is located currently is set to be TT process corner, 0.6 V and 25° C. The frequency of the system clock is 100 MHz, that is, the cycle is 10 ns. When the timing of the system is relatively tight, the timing early-warning signal error_all is generated. The signal is immediately fed back to the adaptive clock stretching circuit, and the clock is stretched to a clock cycle of 10.42 ns in the current cycle, which effectively relieves the problem of the tight timing of the system under a low voltage.

It can be seen that the present invention is especially suitable for an adaptive voltage frequency scaling circuit based on on-line timing monitoring. When a timing violation occurs during circuit operation, the control signals are generated to stretch the clock to increase the timing slack of the circuit, so as to avoid errors during the operation of the circuit. When the timing slack is relatively sufficient, the clock is compressed to reduce the timing slack as much as possible, so as to improve circuit performance and reduce power consumption.

The above results show that the present invention can rapidly realize the clock stretching or compressing function in the current cycle. The overall system functions are correct. The adaptive clocking circuit used is simple in structure, good in precision and small in error.

What is claimed is:

1. A bi-directional adaptive clocking circuit supporting a wide frequency range, comprising:
   a phase clock generating module, with an input end connected with a system clock, and generating N delay clock signals with different phases, wherein N is an integer greater than 1,
   an adaptive clock stretching or compressing amount regulating circuit module, with an input end receiving a timing early-warning signal sent out by a chip or delay information of a critical path of the chip and receiving the N delay clock signals with the different phases output by the phase clock generating module, monitoring a timing slack or a timing violation value of the chip in real time, and outputting a stretching scale signal after the timing slack of the chip is widened according to the N delay clock signals with the different phases, or outputting a compressing scale signal after the timing violation value is widened according to the N delay clock signals with the different phases,
   a control module, with an input end receiving the stretching scale signal or the compressing scale signal output by the adaptive clock stretching or compressing amount regulating circuit module, and generating adaptive clock selecting control signals, and
   a phase clock selecting module, with an input end receiving the adaptive clock selecting control signals and the N delay clock signals with the different phases, and selecting a target phase clock signal from the N delay clock signals with the different phases to be output.

2. The bi-directional adaptive clocking circuit supporting the wide frequency range according to claim 1, wherein the phase clock generating module comprises:
   a phase clock generating circuit of a double-delay-line structure, comprising a fast delay line and a slow delay line, wherein each delay line of the fast delay line and the slow delay line is formed by series connection of N/2 levels of delay units, each level of the N/2 levels of delay units is connected with one level of inverters behind to generate an inverted clock signal, signals output by a same level of delay units on the each delay line are subjected to inverse processing and then input to an AND gate to obtain clock signals Φ[1]-Φ[N/2] generated by a current level of delay units through AND operation, the signals output by the same level of delay units on the each delay lines are subjected to inverse processing and then input to an OR gate to obtain inverted clock signals Φ[N/2+1]-Φ[N] generated by the current level of delay units through OR operation, the N delay clock signals with the different phases are totally generated, head ends of the fast delay line and the slow delay line are both connected with two 2-to-1 data selectors taking a system clock signal and a power supply signal as input signals, and address signal input ends of the two 2-to-1 data selectors are connected with a configuration signal, wherein the configuration signal indicates that only one delay line works at the same moment, and a time-digital-converter circuit, comprising M D flip-flops for detecting information of the fast delay line and the slow delay line, wherein the M D flip-flops all take the system clock signal as a clock input, input ends of the M D flip-flops are respectively connected with M clock signals generated by the same delay line, when a current system clock frequency meets a requirement of the fast delay line, a first configuration signal indicating that the fast delay line works and the slow delay line does not work is input into the two 2-to-1 data selectors at the head ends of the two delay lines, and when the current system clock frequency meets the requirement of the slow delay line, a second configuration signal indicating that the slow delay line works and the fast delay line does not work is input into the two 2-to-1 data selectors at the head ends of the two delay lines, wherein M is less than or equal to N/2.

3. The bi-directional adaptive clocking circuit supporting the wide frequency range according to claim 1, wherein the phase clock selecting module comprises:

a phase clock receiving circuit, configured to correctly receive the adaptive clock selecting control signals from the control module, and comprising N low-level transparent latches and N AND gates, wherein data input ends of the N low-level transparent latches are all connected with the adaptive clock selecting control signals, clock input ends of the N low-level transparent latches are respectively connected with one clock signal generated by the phase clock generating module, and the clock signal connected to a clock input end of one low-level transparent latch of the N low-level transparent latches and an output signal of the low-level transparent latch are input signals of one AND gate of the N AND gates, and an N-input OR gate circuit, with input ends connected with output ends of the N AND gates, and selecting the target phase clock signal from the N delay clock signals with the different phases to be output.

4. The bi-directional adaptive clocking circuit supporting the wide frequency range according to claim 1, wherein the adaptive clock stretching or compressing amount regulating circuit module comprises:

a frequency-halving circuit, with an input end connected with a clock signal, and performing frequency-halving on the clock signal to obtain frequency-divided clock signals, a critical path replica module formed by series connection of multiple levels of combinational logic gates, with an input end connected with an output end of the frequency-halving circuit, and outputting the delay information of the critical path, a 2-to-1 data selector circuit, with a data input end connected with the timing early-warning signal provided by an on-line timing transition detector and the delay information of the critical path output by the critical path replica module, and with an address input end connected with a clock stretching or compressing function selecting signal, and a transition detector group circuit, composed of N/2 transition detectors and N/2 high-level transparent latches, wherein input ends of all the N/2 transition detectors are connected with an output end of the 2-to-1 data selector circuit, an output end of each transition detector of the N/2 transition detectors is connected with a data input end of one high-level transparent latch of the N/2 high-level transparent latch, the N/2 high-level transparent latches in series connection with the output end of the each transition detector and the N/2 transition detectors are simultaneously connected with one delay clock signal generated by the phase clock generating module, and output signals of all the high-level transparent latches constitute the stretching scale signal or the compressing scale signal for directing selecting of a clock stretching or compressing amount.

5. The bi-directional adaptive clocking circuit supporting the wide frequency range according to claim 1, wherein the control module comprises:

a state machine circuit, with an input end connected with current timing information of the chip, and outputting a control instruction for switching a system to be in a clock stretching, maintaining or compressing state, and a decoder circuit, with an input end connected with the stretching scale signal or the compressing scale signal output by the adaptive clock stretching or compressing amount regulating circuit module, and outputting the adaptive clock selecting control signals.

6. The bi-directional adaptive clocking circuit supporting the wide frequency range according to claim 4, wherein the clock signal connected to the input end of the frequency-halving circuit is the target phase clock signal output by the phase clock selecting module.

7. The bi-directional adaptive clocking circuit supporting the wide frequency range according to claim 2, wherein determining principles of the number of the delay units on the each delay line are as follows: simulation is performed under all PVT conditions, a phase difference between a last level of phase clocks of a single delay line of the fast delay line and the slow delay line and the system clock approaches to $\pi$, and frequency ranges of the fast delay line and the slow delay line have intersection and are configured to adapt to wide-frequency.

8. The bi-directional adaptive clocking circuit supporting the wide frequency range according to claim 4, wherein the N/2 transition detectors take a clock high level as a timing monitoring window to be inserted into the critical path of a system and monitor timing, and the timing early-warning signal is fast generated when the timing of the system is relatively tight.

* * * * *